United States Patent
Nilsson et al.

(10) Patent No.: US 11,337,090 B2
(45) Date of Patent: May 17, 2022

(54) TELEMATICS VERIFICATION SYSTEM

(71) Applicant: Volvo Car Corporation, Gothenburg (SE)

(72) Inventors: Mikael Nilsson, Torslanda (SE); Fredrik Tufvesson, Lund (SE)

(73) Assignee: Volvo Car Corporation, Gothenburg (SE)

( * ) Notice: Subject to any disclaimer, the term of this patent is extended or adjusted under 35 U.S.C. 154(b) by 90 days.

(21) Appl. No.: 16/738,119

(22) Filed: Jan. 9, 2020

(65) Prior Publication Data
US 2020/0245165 A1 Jul. 30, 2020

(30) Foreign Application Priority Data

Jan. 28, 2019 (EP) .................................... 19153923

(51) Int. Cl.
*H04W 24/08* (2009.01)
*H04W 4/40* (2018.01)

(52) U.S. Cl.
CPC ............. *H04W 24/08* (2013.01); *H04W 4/40* (2018.02)

(58) Field of Classification Search
CPC ...... H04W 24/08; H04W 4/40; H01Q 1/3275; H04B 17/3911; H04B 17/0085; H04B 17/0087; H04B 17/15; H04B 17/20; G01R 31/006; G01R 29/105; G01R 29/0821; G01R 29/0835; G01R 31/007; H04L 67/12
See application file for complete search history.

(56) References Cited

U.S. PATENT DOCUMENTS

| | | | |
|---|---|---|---|
| 7,146,307 B2 | 12/2006 | Mocek | |
| 7,596,437 B1 | 9/2009 | Hunt et al. | |
| 8,615,206 B2 | 12/2013 | Meng | |
| 9,742,508 B1 | 8/2017 | Kyosti et al. | |
| 2005/0037825 A1* | 2/2005 | Faranda | H04B 1/3877 455/575.9 |

(Continued)

FOREIGN PATENT DOCUMENTS

| | | |
|---|---|---|
| EP | 3182619 A1 | 6/2017 |
| WO | 20150113649 A1 | 8/2015 |

OTHER PUBLICATIONS

Jul. 18, 2019 European Search Report issue on International Application No. EP19153923.

*Primary Examiner* — Steven H Nguyen
(74) *Attorney, Agent, or Firm* — Clements Bernard Walker; Christopher L. Bernard (57) ABSTRACT

A telematics verification system for testing of a vehicle telematics system, the telematics verification system comprising: an electromagnetically shielded compartment adapted to be arranged to cover antennas of the vehicle when testing the vehicle telematics system using the telematics verification system while operating the vehicle; a set of downlink antennas adapted to be arranged inside the electromagnetically shielded compartment, the set of downlink antennas are configured to wirelessly transmit a downlink signal inside the electromagnetically shielded compartment, wherein the signal indicative of the downlink signal is wirelessly receivable by the antennas of the vehicle, and an uplink antenna adapted to be arranged inside the electromagnetically shielded compartment, the uplink antenna is adapted to wirelessly receive uplink signals transmitted by the antennas of the vehicle.

12 Claims, 5 Drawing Sheets

(56) References Cited

U.S. PATENT DOCUMENTS

| | | | |
|---|---|---|---|
| 2006/0273967 A1* | 12/2006 | Gat | H01Q 1/3275 343/713 |
| 2012/0139571 A1* | 6/2012 | Nickel | G01R 29/0821 324/750.26 |
| 2013/0093447 A1* | 4/2013 | Nickel | H04W 24/06 324/750.16 |
| 2014/0195069 A1* | 7/2014 | Morimoto | B60W 30/18154 701/1 |
| 2015/0017928 A1* | 1/2015 | Griesing | H04B 17/0087 455/67.14 |
| 2017/0012714 A1* | 1/2017 | Kildal | G01R 29/0821 |
| 2017/0093509 A1 | 3/2017 | Kyosti | |
| 2017/0372431 A1 | 12/2017 | Perl et al. | |
| 2018/0241420 A1* | 8/2018 | Nakano | H05K 9/0049 |
| 2018/0375594 A1* | 12/2018 | Kildal | H04B 17/29 |

* cited by examiner

TELEMATICS VERIFICATION SYSTEM

CROSS-REFERENCE TO RELATED APPLICATION

The present disclosure claims the benefit of priority of co-pending European Patent Application No. 19153923.8, filed on Jan. 28, 2019, and entitled "A TELEMATICS VERIFICATION SYSTEM," the contents of which are incorporated in full by reference herein.

TECHNICAL FIELD

The present disclosure relates to a telematics verification system for testing of a vehicle telematics system.

BACKGROUND

Vehicle telematics is a relatively broad field that includes telecommunication and informatics for applications in road vehicles. Example applications include cellular technology and WLAN.

It is desirable to test the telematics systems in order to evaluate the communication links in the telematics systems before it is released on the market. Testing of the communication links of the telematics system of a vehicle requires a controlled environment with little or no radio interference. This may be achieved by testing the telematics system before it is installed in a vehicle or by removing a telematics system from the vehicle and place it in a shielded environment. However, in such case the telematics system is isolated from other electronic systems of the vehicle and would thus not provide a realistic testing situation for the telematics system.

Another option is to place the vehicle including the telematics system inside a shielded room or an anechoic chamber. However, such shielded rooms or anechoic chambers are costly.

Accordingly, there is a need for a cost-efficient testing system for testing of vehicle telematics systems that can provide more realistic testing situations.

SUMMARY

The present disclosure describes a telematics verification system for testing of a vehicle telematics system. The proposed telematics verification system provides a cost-efficient verification of vehicle telematics systems which enables for testing during more realistic situations compared to having the vehicle inside a shielded room or an anechoic chamber.

The advantage is provided by the provision of electromagnetically shielded compartment adapted to be arranged to cover antennas of the telematics unit of the vehicle for testing the vehicle telematics system while the vehicle is operative. Downlink antennas of the telematics verification system are arrangeable inside the electromagnetically shielded compartment and may thereby wirelessly transmit a downlink signal inside the electromagnetically shielded compartment.

Advantageously, the electromagnetically shielded compartment is arrangeable on the exterior surface of the vehicle, to cover the vehicle antennas. Thereby, the vehicle can operate in a test rig, climate chamber, or in realistic environments such as in cities, in urban environments and more remote country side environments, at the same time as testing of the telematics system inside electromagnetically shielded compartment.

Furthermore, in order to be able to also provide an uplink connection, an uplink antenna is provided and is adapted to be arranged inside the electromagnetically shielded compartment. The uplink antenna is adapted to receive uplink signals transmitted by the antennas of the vehicle. In other words, embodiments of the present disclosure provides for complete testing of a two-way communication system in realistic environments, such as when operating with the vehicle on roads or operating the vehicle at test facilities.

Accordingly, in a first aspect of the invention, there is provided a telematics verification system for testing of a vehicle telematics system, the telematics verification system comprising: an electromagnetically shielded compartment adapted to be arranged to cover antennas of the vehicle when testing the vehicle telematics system using the telematics verification system while operating the vehicle.

The telematics verification system further comprises a set of downlink antennas adapted to be arranged inside the electromagnetically shielded compartment, the set of downlink antennas are configured to wirelessly transmit a downlink signal inside the electromagnetically shielded compartment, wherein the signal indicative of the downlink signal is wirelessly receivable by the antennas of the vehicle.

Furthermore, the telematics verification system comprises an uplink antenna adapted to be arranged inside the electromagnetically shielded compartment, the uplink antenna is adapted to wirelessly receive uplink signals transmitted by the antennas of the vehicle.

Advantageously, the electromagnetically shielded compartment is adapted to remain mounted on the vehicle for testing the vehicle telematics system using the telematics verification system while operating the vehicle. Further, this also enables testing of the vehicle telematics system at the same time as testing other functions and systems of the vehicle that may require realistic testing environments.

The electromagnetically shielded compartment may be defined by a box made from a suitable material such as a metal.

According to a second aspect of the invention, there is provided a method for performing verification of a vehicle telematics system, the method comprising: providing a telematics verification system comprising an electromagnetically shielded compartment; arranging the electrically shielded compartment on a vehicle so that the electrically shielded compartment covers antennas of the vehicle; transmitting a downlink signal from a set of downlink antennas arranged in the electromagnetically shielded compartment, wherein a signal indicative of the downlink signal is wirelessly received by the vehicle antennas; and evaluating the signal received by the vehicle antenna. Advantageously, this provides for at least evaluating the downlink communication link of the telematics system.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

These and other aspects of the present invention will now be described in more detail, with reference to the appended drawings showing example embodiments of the invention, wherein.

DESCRIPTION OF EMBODIMENTS

In the present detailed description, various embodiments of the telematics verification system according to the present disclosure are described. However, this invention may be embodied in many different forms and should not be construed as limited to the embodiments set forth herein; rather, these embodiments are provided for thoroughness and completeness, and fully convey the scope of the invention to the skilled person. Like reference characters refer to like elements throughout.

Figure 1:
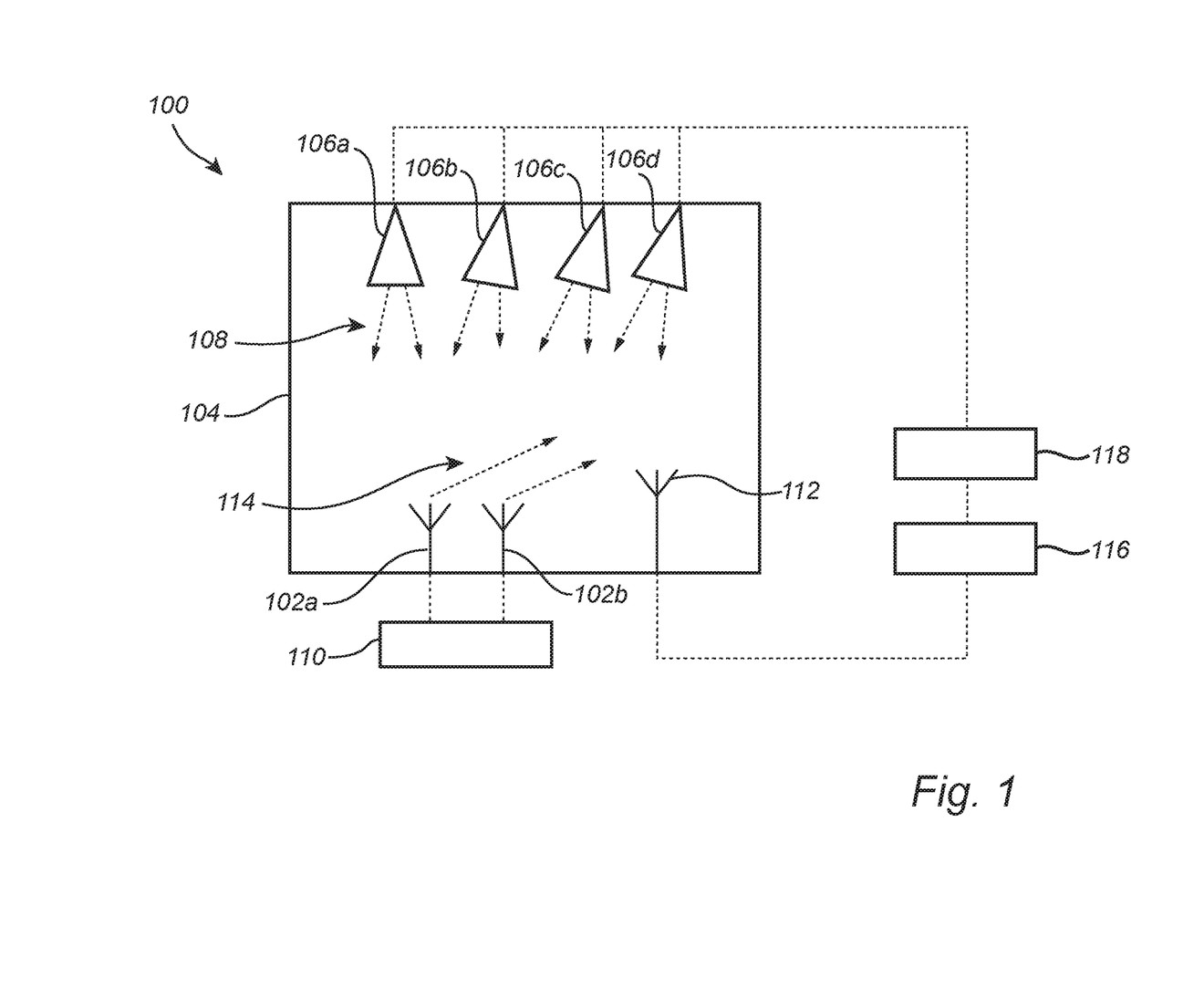
FIG. 1 conceptually illustrates a telematics verification system according to embodiments of the present disclosure.

FIG. 1 conceptually illustrates an example telematics verification system 100 according to embodiments of the present disclosure. The telematics verification system 100 is configured for testing of a vehicle telematics system including antennas 102a and 102b. The antennas 102a-b may be configured for wireless communication using e.g. 2G, 3G, 4G, 5G, or WLAN network technology such as the family of wireless 802.11 standards and may be used for reception and transmission of broadband signals. Specifically, it can also be configured for GPS or wireless vehicular communication standards such as DSRC, ITS-G5, or cellular-ITS solutions.

The telematics verification system 100 comprises an electromagnetically shielded compartment 104 provided as a shielded box adapted to cover antennas 102a-b of the vehicle. The electromagnetically shielded compartment 104 has necessary input opening(s) for the insertion of the antennas 102a-b to the inside of the electromagnetically shielded compartment 104.

A set of downlink antennas 106a-d are adapted to be arranged inside the electromagnetically shielded compartment 104. The set of downlink antennas 106a-d are configured to transmit downlink signals 108 inside the electromagnetically shielded compartment 104. The downlink signals 108 are wirelessly receivable by the vehicle antennas 102a-b. Thus, for testing of downlink transmission, i.e. transmission of wireless signals to the vehicle telematics system, downlink signals 108 are transmitted by the downlink antennas 106a-d, and subsequently received by the vehicle antennas 102a-b. A telematics control unit 110 connected to the vehicle antennas 102a-b is configured to evaluate the received signal.

Accordingly, the downlink connection may advantageously be tested in the electromagnetically shielded environment provided by the electromagnetically shielded compartment 104.

Furthermore, an uplink antenna 112 is provided and is adapted to be arranged inside the electromagnetically shielded compartment 104. The uplink antenna 112 is adapted to receive uplink signals 114 transmitted by the antennas 102a-b of the vehicle.

Accordingly, the uplink connection may also advantageously be tested in the electromagnetically shielded environment provided by the electromagnetically shielded compartment 104.

A control unit 110 connected to the vehicle antennas 102a-b is configured to evaluate the received signal.

Embodiments of the present disclosure are based on the realization to provide the electromagnetically shielded environment required for verification of the vehicle telematics system in the form of an electromagnetically shielded compartment which is arrangeable on the vehicle to cover the antennas of the vehicle. This enables to test the vehicle telematics system while operating with the vehicle and operating other systems of the vehicle under realistic conditions, i.e. travelling in real world driving conditions in live traffic or in test rigs and climate chambers, or even in a regular garage.

Furthermore, the embodiments of the present disclosure enable using the so-called wireless cable method for testing of the vehicle telematics system in realistic environments. The wireless cable method is defined by the wireless transmission of the downlink and uplink signals for testing of a multiple input multiple output (MIMO) system, i.e. a system which has several input channels and several output channels such as the antennas 102a-b of the vehicle.

The electromagnetically shielded compartment 104 has necessary feed-through connections for communication cables to e.g. antennas 106a-d and 112.

The downlink antennas 106a-d may be configured to receive the downlink signals from a signal emulator which may be provided in the form of a fading emulator 118. Thus, the downlink antennas 106a-d are connected to the output ports of the fading emulator 118. The operation of a fading emulator 118 is known per se to the skilled person and will not be described in detail herein. Generally, a fading emulator is configured to perform convolution between an originally transmitted signal and a secondary function, for example a function to emulate different radio propagation environments, and emulate noise, electromagnetic interference or internal disturbance generated by the vehicle in order to create a realistic signal including e.g. noise. Further, the fading emulator 118 may be configured to phase or amplitude tune the downlink signals so that a specific channel associated with a specific antenna of the vehicle telematics system can be tested. The number of downlink antennas is preferably equal to or exceeds the number of antennas of the vehicle.

The fading emulator 118 may be comprised in the telematics verification system 100.

A communication tester 116 is here schematically illustrated as a box. The communication 116 tester provides a signal source in the form of e.g. a base station simulator unit or a WLAN communication tester depending on the type of communication technology is the subject for verification.

The communication tester 116 is configured to provide the original transmitted signals to the signal emulator, e.g. provided as a fading emulator 118 configured to generate the downlink signals 108. Furthermore, the communication tester 116 is connected to the uplink antenna 112 in order to receive and evaluate the signals received by the uplink antenna 112. The received signals are the uplink signals 114 transmitted by the vehicle antennas 102a-b. As mentioned above the signal source may be provided in the form of base station simulator unit or a WLAN communication tester. In some embodiments the uplink antenna is connected to an external antenna to communicate with a true base station as will be described below.

A base station simulator unit is advantageously configured to mimic a true base station. Thus, the base station simulator unit which mimics a true base station provides for testing of the uplink connection of the vehicle telematics systems in realistic environments despite the vehicle antennas 102-b being shielded.

The communication tester 116 provided as a base station simulator unit or a WLAN communication tester may be comprised in the telematics verification system 100.

There may be further components included in the system such as power amplifiers e.g. between the fading emulator and the downlink antennas. These further components are known and will no be discussed further herein.

The electromagnetically shielded compartment 104 is adapted to attenuate external radio signals to provide a controllable radio environment inside the compartment. Preferably the external radio signals are significantly attenuated such that a controllable radio environment is provided inside the compartment even in realistic traffic situations when operating with the vehicle comprising the telematics system. The shielded box 104 may be made from a metal and may further be covered on the inside by attenuating material (so called radio absorbents) to attenuate reflections inside the box.

For use of the telematics verification system, the electromagnetically shielded compartment provided as a shielded box may be placed inside the vehicle. The vehicle antennas may be removed from the normal mounting place on the vehicle and placed inside the box.

Figure 2:
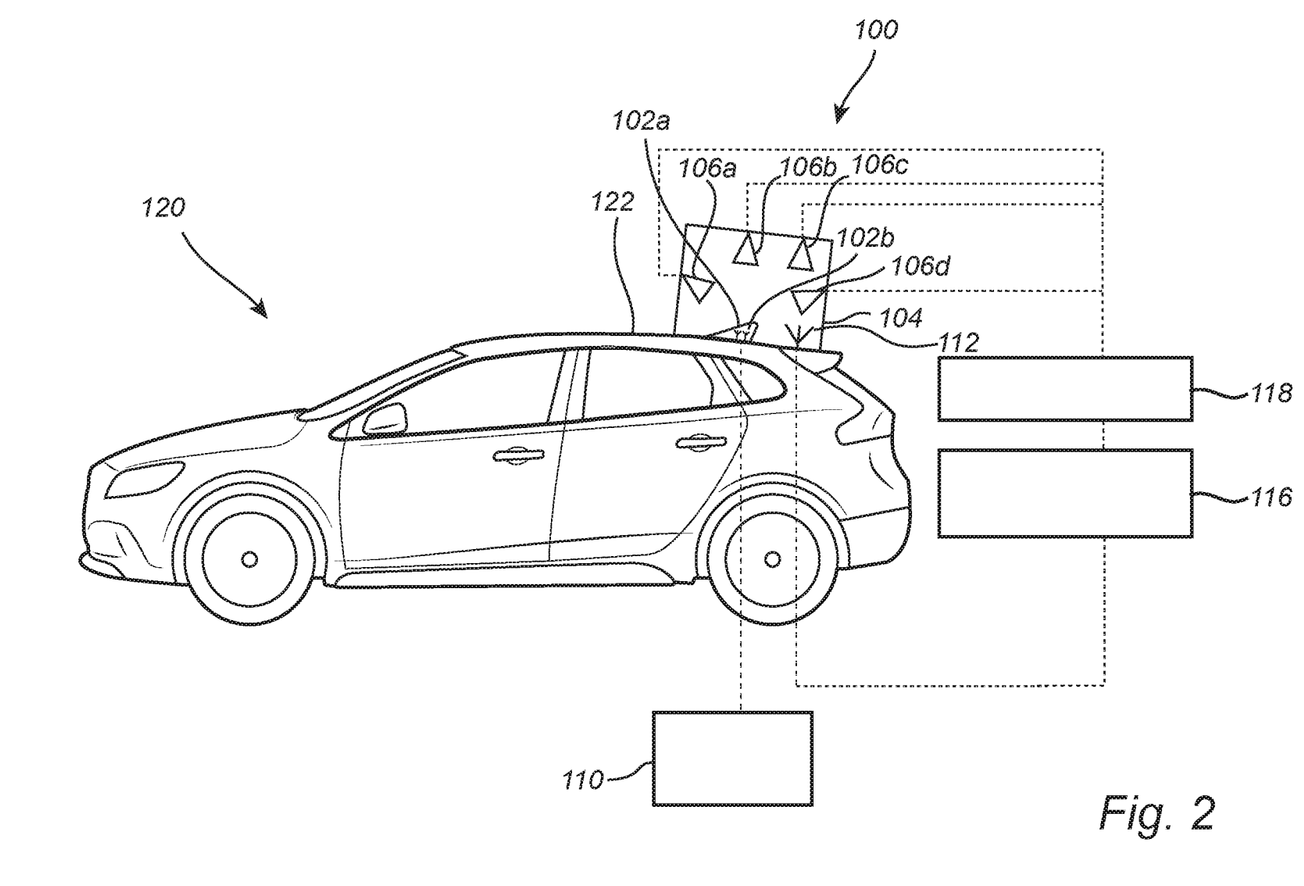
FIG. 2 conceptually illustrates an example telematics verification system arranged on a vehicle according to embodiments of the present disclosure.

FIG. 2 illustrates another advantageous possibility for using the telematics verification system 100. Here, the telematics verification system 100 is arranged on a vehicle 120. In this example illustrative implementation, the electromagnetically shielded compartment is mounted to the vehicle roof 122 to cover the antennas 102a-b. As illustrated, the electromagnetically shielded compartment 104 also accommodates the downlink antennas 106a-d and the uplink antenna 112.

Accordingly, the electromagnetically shielded compartment 104 is advantageously fixedly mountable on the vehicle 100. In the presently described embodiment the electromagnetically shielded compartment 104 is fixedly mountable on the vehicle roof 122 to thereby enclose the antennas 102a-b inside the electromagnetically shielded compartment 104.

The electromagnetically shielded compartment 104 is preferably adapted to remain mounted on the vehicle 120 for testing the vehicle telematics system using the telematics verification system 100 while operating the vehicle. In this way, the telematics system of the vehicle 120 may advantageously be tested while the vehicle 120 is operating and thereby able to use other sub-systems of the vehicle 120, such as electronic control systems in realistic traffic situations, or in a test rig, or a climate chamber, or in a garage. In other words, being able to mount the electromagnetically shielded compartment 104 on the vehicle 120 to enclose the vehicle antennas 102a-b provides for testing the vehicle telematics under truly realistic traffic situations while operating the vehicle 120.

Mounting the electromagnetically shielded compartment 104 on the vehicle may be performed by bolting it to e.g. the vehicle roof.

The fading emulator 118 and the communication tester 116 (e.g. base station emulator or WLAN communication tester) are schematically shown outside the vehicle for clarity in the drawing, but in practical implementations they may be placed inside the vehicle 120.

Figure 3:
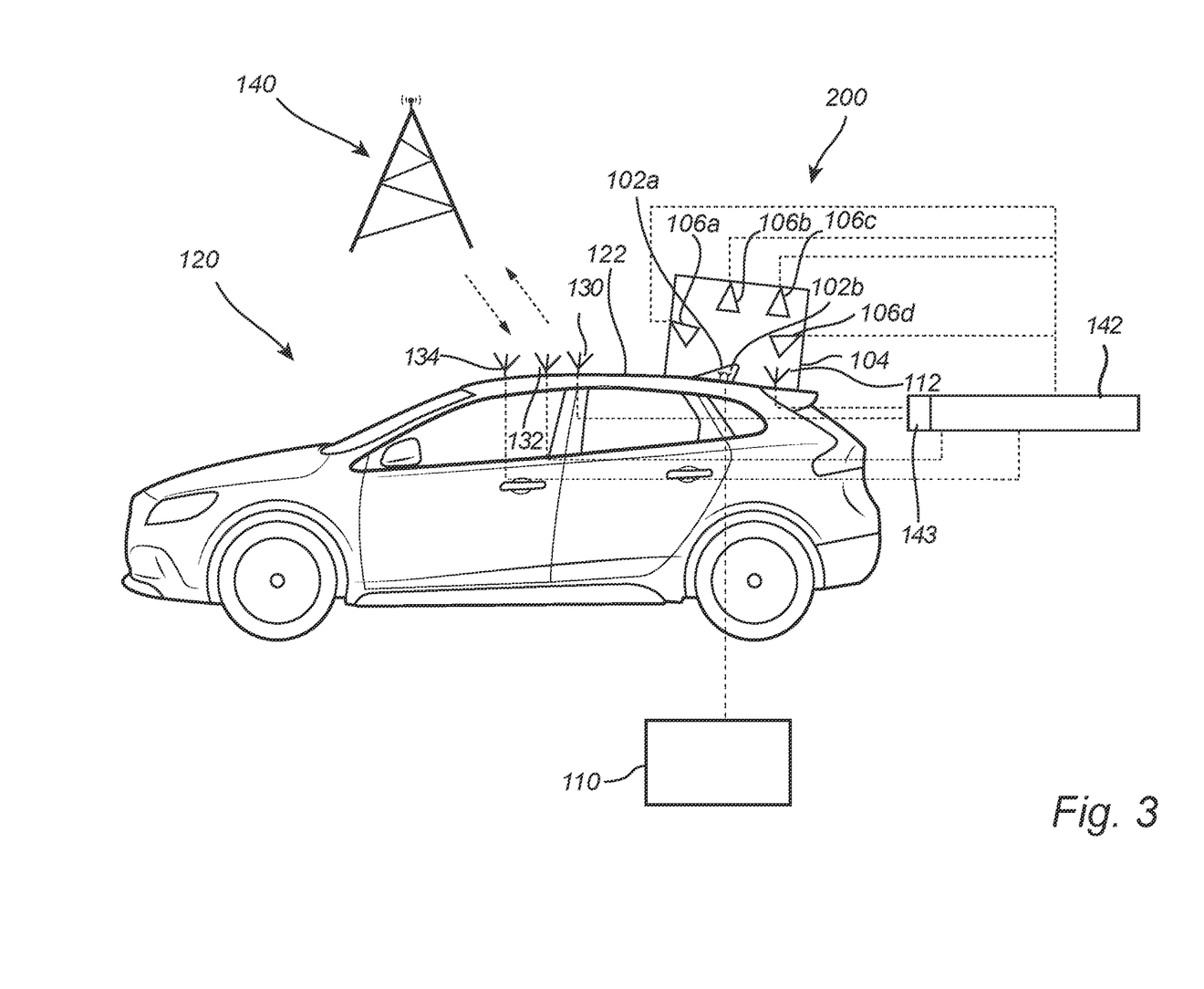
FIG. 3 conceptually illustrates another example telematics verification system arranged on a vehicle according to embodiments of the present disclosure.

FIG. 3 illustrates the telematics verification system 200 when arranged on a vehicle 120. The uplink antenna 112 is connected to an external antenna 130 via a converter unit 143 adapted to transmit the uplink signal to a communications network 140. The converter unit 143 may be comprised in the signal emulator 142 and may be configured to convert signals between different frequencies and/or network technologies. The signal emulator 142 is connected to a set of external antennas 132, 134 adapted to receive transmitted signals from the communications network 140 and to provide the transmitted signals to the signal emulator 142.

Accordingly, in this example implementation, one 130 of the antennas is configured to transmit uplink signals which were originally transmitted by the vehicle antennas 102a-b and received by the uplink antenna 112 arranged in the shielded environment 104, to the communication network 140. A set of external receiving antennas 132, 134 are configured to receive signals from the communication network 140 (e.g. a base station) and to provide them to the signal emulator 142.

With this setup, it is possible to test the telematics system of the vehicle against the real world communications network e.g. connected to the cloud via world e.g. 2G, 3G, 4G, 5G, or WLAN network technology) in real world radio environments. For example, it provides the possibility to emulate travelling with the vehicle to different radio environments for testing of the telematics system.

In addition, the signal emulator 142 is configured to convert the received signal to a downlink signal at an arbitrary frequency and arbitrary wireless communication standard, for the downlink antennas 106a-d to transmit. In other words, it is possible to test real world signals at any frequency and any communication standard. This is inherently difficult to do with prior art systems since it may require shutting down or altering the public communication network.

Generally, a signal emulator comprises a dedicated receiver configured to receive signals from the external network via e.g. the antennas 132 and 134 for providing data to base station emulator to be transmitted at an arbitrary frequency and arbitrary standard to the vehicle, and a dedicated transmitter configured to transmit signals to the external network 140 based on data received at an arbitrary frequency and arbitrary standard from the vehicle.

The signal emulator 142 may comprise a fading emulator. The signal emulator 142 may also comprise a communication tester.

Figure 4:
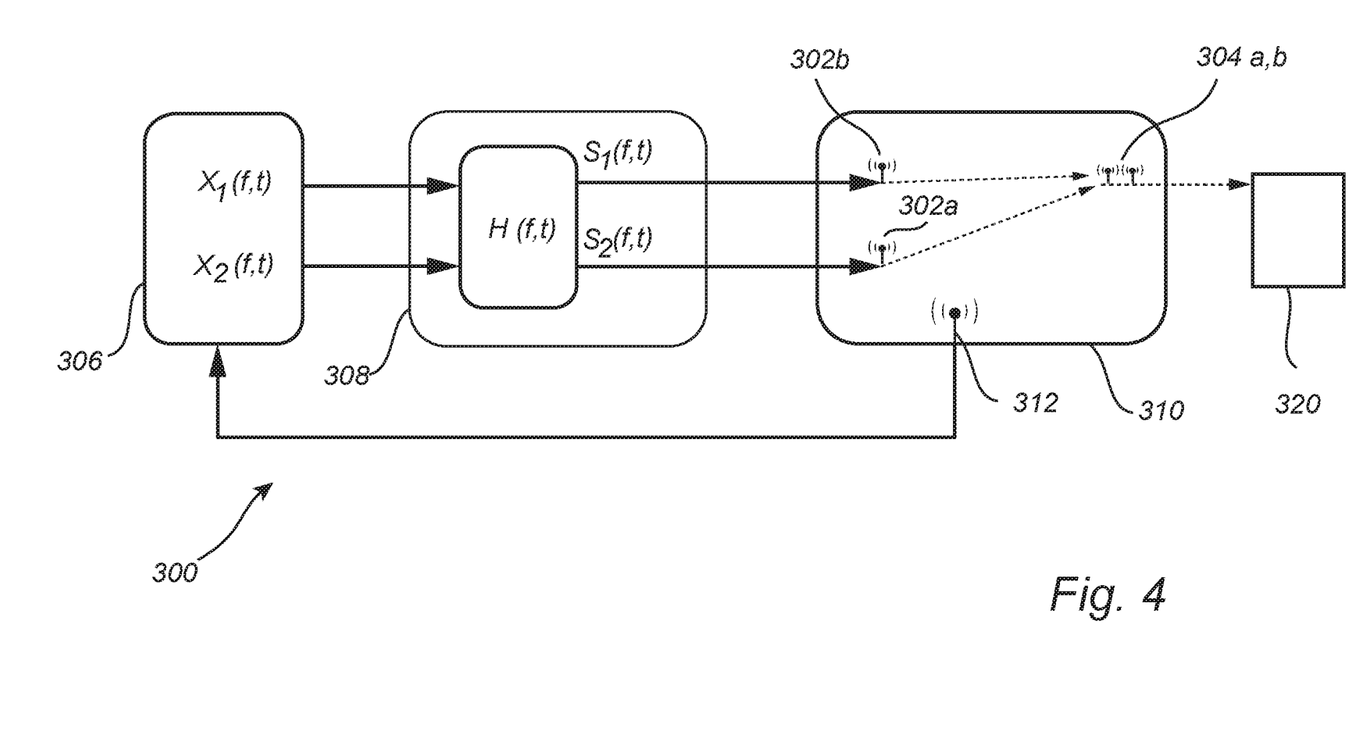
FIG. 4 is a flow-chart of method steps according to embodiments of the invention.

FIG. 4 is a schematic functional overview of an example telematics verification system according to the present disclosure. Here, the telematics verification system is shown as a 2 by 2 MIMO system, i.e. there are two downlink antennas 302a-b and two receiving and transmitting vehicle antennas 304a-b. A base station simulator unit 306 which emulates a wireless network end of the connection link is configured to provide the originally transmitted signals $x_1(f,t)$ and $x_2(f,t)$ to a fading emulator 308. The signals $x_1(f,t)$ and $x_2(f,t)$ are time and frequency variant.

The fading emulator 308 is configured to simulate how a real-world transmitter may behave. The fading emulator may thus add noise to the signals $x_1(f,t)$ and $x_2(f,t)$. For example, the fading emulator may apply a convolution to $x_1(f,t)$ and $x_2(f,t)$ in order to provide a faded representation of the original $x_1(f,t)$ and $x_2(f,t)$, here shown as $s_1(f,t)$ and $s_2(f,t)$. The convolution is here represented by the impulse response matrix H. The fading emulator may perform the convolution on the signals $x_1(f,t)$ and $x_2(f,t)$ with an impulse response which is based on measured antenna responses of the vehicle antennas 304a-b and the external propagation channel. This provides an emulated real-world radio signal inside the shielded environment provided by the environmentally shielded compartment 310. It is also possible to add noise and interference to the transmitted signals in order to make the test setup even more realistic.

In order to be able to individually test the channels of the telematics system it is important to be able to transmit downlink signals from the downlink antennas 302a-b so that they are only received by one of the vehicle antennas 304a or 304b. For this, the fading emulator 306 may also be configured to apply a precoding scheme (i.e. suitable for MIMO communication networks) which may include controlling the phase and amplitude of the downlink signals to be tuned for a presently targeted antenna 304a or 304b. With knowledge of the characteristics of the antennas 304a and 304b, and the propagation channel within the shielded box it is possible to tune the amplitudes and phases of the downlink signals so that e.g. the sum of the signals equals zero at one of the antennas 304a or 304b and the specifically generated faded signal is only received by the other antenna of 304b or 304b.

The above described precoding scheme is often referred to as a so-called zero-forcing scheme. Zero-forcing and other precoding schemes are per se known techniques and will not be described in further detail herein. For example, spatial multiplexing may be used where each of the vehicle antennas uses channel estimation techniques to separate the signals from the different downlink antennas 302a-b.

FIG. 4 further conceptually illustrates an uplink antenna 312 connected to the base station simulator 306. There is further shown telematics control unit 320 connected to the vehicle antennas 304a-b.

Figure 5:
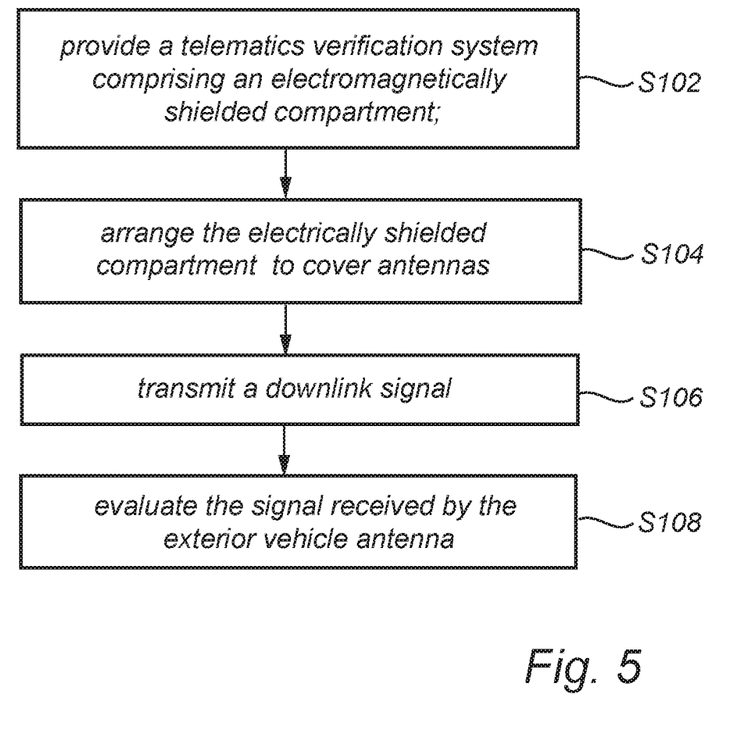
FIG. 5 is a flow-chart of method steps according to embodiments of the invention.

FIG. 5 is a flow-chart of method steps according to embodiments of the present disclosure. The method steps are provided for performing verification of a vehicle telematics system. In step S102 is a telematics verification system provided comprising an electromagnetically shielded compartment. The electrically shielded compartment is arranged on a vehicle so that the electrically shielded compartment covers antennas of the vehicle in step S104. Further, in step S106, transmitting a downlink signal from a set of downlink antennas arranged in the electromagnetically shielded compartment. A signal indicative of the downlink signal is wirelessly received by the vehicle antennas. Subsequently, evaluating S108 the signal received by the vehicle antenna.

The steps of transmitting downlink signals and evaluating the received signals may be performed by a control unit.

Figure 6:
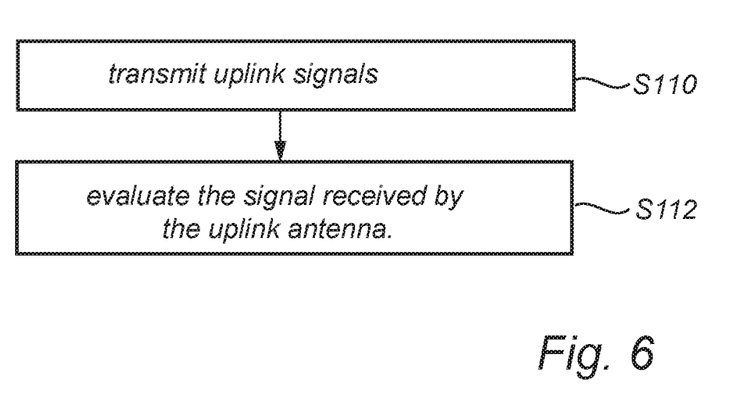
FIG. 6 is a flow-chart of method steps according to embodiments of the invention.

FIG. 6 is a flow-chart of method steps according to further embodiments of the present disclosure. Subsequently, in step S110 uplink signals are transmitted using the vehicle antennas. The uplink signal is receivable by an uplink antenna arranged inside electromagnetically shielded compartment. Next, evaluate S112 the signal received by the uplink antenna.

The steps of transmitting uplink signals and evaluating the received signals may be performed by a control unit.

The notion "uplink" is intended to also cover the commonly used term "upstream" and the term "downlink" is intended to also cover the commonly used term "downstream", where upstream and down stream is often used in e.g. WLAN and Wi-Fi systems.

The connections between the downlink antennas and the signal emulator, between the fading emulator and the communication tester, and between the uplink antenna and the communication tester may be provided by coaxial cables.

The control unit may include a microprocessor, microcontroller, programmable digital signal processor or another programmable device, as well as be embedded into the vehicle/power train control logic/hardware. The control unit may also, or instead, include an application-specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device.

The person skilled in the art realizes that the present invention by no means is limited to the preferred embodiments described above. On the contrary, many modifications and variations are possible within the scope of the appended claims.

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

What is claimed is:

1. A telematics verification system for testing of a vehicle telematics system, the telematics verification system comprising:
    an electromagnetically shielded compartment adapted to be fixedly mountable on a vehicle exterior surface to enclose and fully electromagnetically shield antennas of a vehicle, and adapted to remain mounted on the vehicle when testing the vehicle telematics system using the telematics verification system while operating the vehicle in a real traffic situation;
    a set of downlink antennas adapted to be arranged inside and fully electromagnetically shielded by the electromagnetically shielded compartment while the electromagnetically shielded compartment is mounted on the exterior surface of the vehicle while operating the vehicle in the real traffic situation, the set of downlink antennas are configured to wirelessly transmit a downlink signal inside the electromagnetically shielded compartment, wherein the signal indicative of the downlink signal is wirelessly receivable by the antennas of the vehicle, and
    an uplink antenna adapted to be arranged inside and fully electromagnetically shielded by the electromagnetically shielded compartment while the electromagnetically shielded compartment is mounted on the exterior surface of the vehicle while operating the vehicle in the real traffic situation, the uplink antenna is adapted to wirelessly receive uplink signals transmitted by the antennas of the vehicle.

2. The telematics verification system according to claim 1, wherein the downlink signals are convolutions of originally transmitted signals and an impulse response function representing a radio channel.

3. The telematics verification system according to claim 1, wherein the downlink antennas are configured to receive the downlink signals from a signal emulator or a fading emulator.

4. The telematics verification system according to claim 2, wherein a communication tester is configured to provide original transmitted signals to a signal emulator or a fading emulator configured to generate the downlink signals.

5. The telematics verification system according to claim 1, wherein the communication tester is a base station unit, or a WLAN tester, or a modem configured to transmit the original transmitted signals to a signal emulator or a fading emulator configured to generate the downlink signals.

6. The telematics verification system according to claim 1, wherein the uplink antenna is connected to an external antenna through a converter adapted to transmit the uplink signal to a communications network via the external antenna, and the signal emulator is connected to a set of external antennas adapted to receive originally transmitted signals from the communications network and to provide the originally transmitted signals to the signal emulator which is configured to convert the originally received signal to a downlink signal at an arbitrary frequency and arbitrary wireless communication standard.

7. The telematics verification system according to claim 5, wherein the signal emulator unit comprises a fading emulator.

8. The telematics verification system according to claim 3, wherein the signal emulator or the fading emulator is comprised in the telematics verification system.

9. The telematics verification system according to claim 1, wherein the electromagnetically shielded compartment is defined by a metal box adapted to attenuate external radio signals from all directions outside of the vehicle to provide a controllable radio environment inside the metal box.

10. The telematics verification system according to claim 1, configured to test the vehicle telematics system using wireless cable method.

11. A method for performing verification of a vehicle telematics system, the method comprising:
providing a telematics verification system comprising an electromagnetically shielded compartment;
arranging the electrically shielded compartment on a vehicle so that the electrically shielded compartment covers and fully electromagnetically shields antennas on an exterior surface of the vehicle;
operating the vehicle in a real traffic situation using other vehicle sub-systems;
while operating the vehicle, transmitting a downlink signal from a set of downlink antennas arranged inside and fully electromagnetically shielded by the electromagnetically shielded compartment while the electromagnetically shielded compartment is mounted on the exterior surface of the vehicle while operating the vehicle in the real traffic situation, wherein a signal indicative of the downlink signal is wirelessly received by the vehicle antennas; and
evaluating the signal received by the vehicle antenna.

12. The method according to claim 11, comprising:
transmitting uplink signals using the vehicle antennas, the uplink signal is received by an uplink antenna arranged inside and fully electromagnetically shielded by the electromagnetically shielded compartment while the electromagnetically shielded compartment is mounted on the exterior surface of the vehicle while operating the vehicle in the real traffic situation; and
evaluating the signal received by the uplink antenna.

* * * * *